United States Patent [19]

Kendall et al.

[11] 4,082,864

[45] Apr. 4, 1978

[54] REINFORCED METAL MATRIX COMPOSITE

[75] Inventors: Ernest G. Kendall, El Segundo, Calif.; Roger T. Pepper, Cape Elizabeth, Me.

[73] Assignee: Fiber Materials, Inc., Biddeford, Me.

[21] Appl. No.: 480,090

[22] Filed: Jun. 17, 1974

[51] Int. Cl.$^2$ .......................... C09K 1/66; C23C 1/08; B44D 1/16

[52] U.S. Cl. .............................. 427/248 B; 427/226; 427/253; 427/367; 427/398 R; 427/431; 427/433; 428/607; 428/651

[58] Field of Search .................... 117/106 R, 107.2 R, 117/71 R, 160, 169; 427/253, 367, 398, 431, 433, 236, 248

[56] References Cited

U.S. PATENT DOCUMENTS

| | | | |
|---|---|---|---|
| 3,369,920 | 2/1968 | Bourdeau et al. | 117/118 |
| 3,393,085 | 7/1968 | Howard et al. | 117/46 CQ |
| 3,811,917 | 5/1974 | Diefendorf | 117/106·R |
| 3,860,443 | 1/1975 | Lachman et al. | 117/DIG. 10 |

Primary Examiner—Thomas J. Herbert, Jr.
Assistant Examiner—R. Eugene Varndell
Attorney, Agent, or Firm—Schiller & Pandiscio

[57] ABSTRACT

A carbon fiber reinforced metal matrix composite is produced by depositing a metal boride coating on the surface of the fibers and subsequently immersing the fibers in a molten bath of the metal matrix material. The boride coating is formed by passing carbon fiber through a gaseous mixture of chlorides of the metal and boron in the presence of zinc vapor at elevated temperatures. The subsequent reaction deposits out a submicron lamina of metal boride on the carbon fibers serving to enhance wetting of the fibers by the molten metal, with the lamina preventing chemical reaction between the fibers and metal matrix materials and also providing a strong mechanical bond therebetween.

17 Claims, 1 Drawing Figure

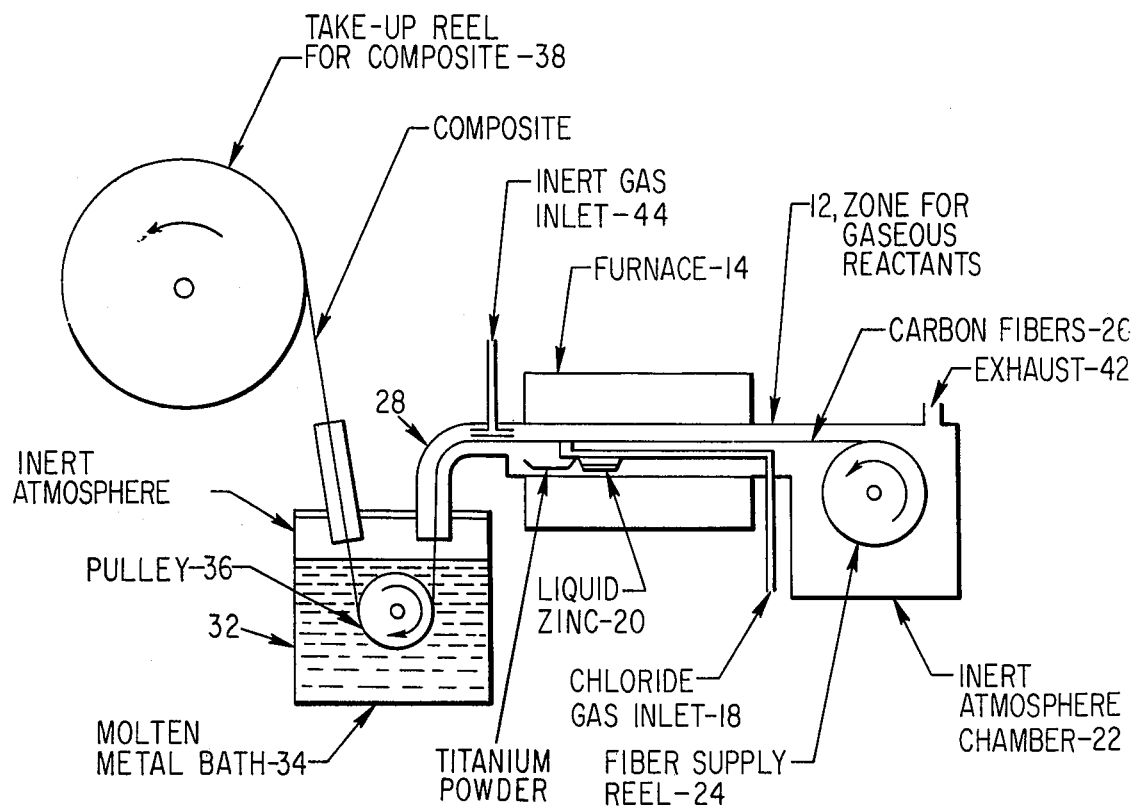

REINFORCED METAL MATRIX COMPOSITE

BACKGROUND OF THE INVENTION

1. Field of the Invention

The present invention relates to composite material including a metal matrix reinforced by internal, generally parallel, continuous high-strength, high modulus carbon/graphite fibers integrally bonded within and to the matrix material.

2. Description of the Prior Art

Graphite and carbon fibers, because of their high strength, are recognized as having excellent potential for reinforcing metal matrix composites. However a lack of chemical compatibility between graphite and many metals and difficulties in achieving a strong mechanical bond in the fiber to metal interface has retarded the development of these composites. Yet another problem area is created by the physical nature of most of the presently commercially available fibers. The fibers are in multi-filament (tow and yarn) form consisting of 1000 to 100,000 strands each of a diameter of about seven microns (typical). Although many metals in liquid form wet the outer surfaces of the fibers, the metals will not penetrate or infiltrate and bond with the inner strands of the fibers. When there is no bond the full strength of the fibers is not imparted to the composite.

Aluminum alloys appear to offer the most potential as a matrix for graphite reinforced metals and consequently have commanded most of the research effort. The usage of an aluminum-graphite composite will be largely controlled by its cost. At a moderate price this composite will be competitive for many applications in aircraft, missiles, automotive, electrical machinery, rocket propulsion systems, launch vehicle structues, and spacecraft. In aircraft, such applications are skins, struts, spars, wing boxes, and helicopter blades. Important applications requiring the 1000° F temperature capability of the aluminum-graphite composite are re-entry shielding for missiles, and compressor blading for gas turbine engines. Launch vehicle structures require light weight materials for stiffening large diameter cylindrical sections, interstages, adapters, tank and equipment support structures. Examples of applications in spacecraft are shells and trusses in the primary structures, and booms, solar cell panels, equipment mounts, and antennas in auxiliary structures. With low cost composites becoming available, widespread non-aerospace industry applications will arise for aluminum-graphite composites. Some such applications are in rapid transit, deep submergence vehicles, sporting goods and rotating parts in electrical generators.

Aside from structural applications graphite-reinforced metals such as copper, aluminum and lead have other unique properties of interest such as high strength combined with good electrical conductivity, low coefficient of friction and high wear resistance, or high dimensional stability over a range of temperature. Copper-graphite and aluminum-graphite composites are of interest for high strength electrical conductors, and aluminum-graphite, lead-graphite, and zinc-graphite composites have potential as bearing materials.

The most promising approach to achieving fiber penetration by and bonding with metals is by coating the fibers with a compatible lamina of submicron thickness. Typical of this approach are the composite preparation processes as described by Sara in U.S. Pat. Nos. 3,553,820 and 3,571,901. Another such process is found in our U.S. Pat. application Ser. No. 131,823 filed Apr. 6, 1971, now U.S. Pat. No. 3,770,488.

Generally, these prior processes have many meritorious features. However they do not provide an optimal solution since some are not well adapted to high volume production while in others dewetting and debonding of the fibers from the metal matrix is experienced in subsequent production processes. Still others fail to achieve a uniform and complete good quality bond between the metal matrix and its reinforcing fibers.

SUMMARY OF THE INVENTION

The graphite/carbon fiber-metal composite of the present invention includes multistranded fibers with each strand being integrally sheathed by a lamina of a metal boride, the metal being from the group IVa of the Periodic Table including Ti, Zr, and Hf, the lamina having a thickness in the approximate range of 0.01 to 2.0 microns. Each fiber is coated with and impermeated by the selected matrix metal so as to provide an elongated strand with a diameter of up to 1/16 inch. Parallel packs of these stands are united under heat and pressure to provide the composite stock or part.

In the case of one selected metal, titanium, its boride is applied to the multistranded fibers by passing the fibers through a heated reacting atmosphere of titanium tetrachloride and boron trichloride in the presence of zinc vapor. The reaction deposits a titanium boride ($Ti_x B_y$) on the fiber with the other reactants passing off in the form of zinc chloride. After passing through the reacting zone the fibers are drawn through a bath of molten metal of the desired matrix material, e.g. aluminum, magnesium, lead, zinc, tin, copper or their alloys. On emerging from the metal bath the fibers retain a heavy coating of the metal which solidifies on cooling to room temperature. In cross section, the thus prepared fiber-metal consists of 20 to 40 volume % fiber and 80 to 60 volume % metal.

BRIEF DESCRIPTION OF THE DRAWING

FIG. 1 is a diagrammatic showing of the apparatus employing the process of coating fibers with metal matrix material.

DESCRIPTION OF THE PREFERRED EMBODIMENT

The Process

The fibers used in the present invention are amorphous carbon with high strength and low modulus, or are partially or wholly graphitic with high strength and high modulus. A typical strand of carbon or graphite yarn consists of 1000 to 100,000 continuous filaments each of approximately 7 microns diameter. These fibers are commercially available under such tradenames or trademarks as Fortafil (Great Lakes Carbon Corp.), Thornal (Union Carbide Corp.) and Modmor (Whittaker-Morgan Inc.).

The initial steps in processing the graphite fibers enhances their wettability and infiltration by the metal matrix material. In this step the fibers are coated with a boride of Ti, Zr, or Hf. One presently preferred boride coating is that of titanium. The empirical formula of the coating is $Ti_x B_y$ with the boron varying from 10 to 40 weight percent. This boride is applied by exposing the fibers to a reacting gaseous atmosphere of titanium tetrachloride and boron trichloride in the presence of zinc vapor. This reaction deposits out on the surface of each filament of the fiber a solid lamina of titanium boride and further yields zinc chloride as a gaseous by-product. It has also been discovered that the reaction of the gases is improved by the presence of a quantity of solid titanium in powder form. This first processing is accomplished within a chamber having its interior at an elevated temperature of approximately 600° to 700° C with an average of 660° C. To facilitate the use of the process the chamber is maintained at atmospheric pressure by a flow of an inert gas, such as argon, serving to exclude oxygen containing air.

It is possible that to some extent the surface carbon of the fibers enter into the reaction of the chloride gases with the coating being of a formula $Ti_xB_yC_z$. The precise composition of the coating has not been established and therefore our reference to a boride coating is also meant to include the borocarbide should that be the actual composition of the coating.

The thickness of the titanium boride coating is directly dependent upon the length of time the fibers are exposed to the reacting chlorides. In practice suitable coatings are built up by exposures of from 1 to 5 minutes with such coating varying between 0.01 to 2.0 microns in thickness.

After the boride coating is deposited on the fibers they are fed through or immersed in a molten bath of the metal of the desired matrix material. The major efforts in strengthening metals by graphite fiber reinforcement is directed to aluminum and aluminum base alloys. These metals are the prime targets of research because of their light weight and the abundance of aluminum in nature. Some examples of aluminum alloys used as matrix material reinforced by graphite in accordance with the present invention are Al-12 Si, Al-7 Si-3 Mg, Al-Mg-0.6 Si-0.25 Cu-0.25 Cr, Al-10 Mg, Al-4.8 Cu-0.5 Ag-0.25 Mg-0.25 Mn, Al-5.2 Mg-0.1 Cr-0.1 Mn and 99 Al(min.).

Upon emerging from the bath of molten metal the fibers retain an adsorbed quantity of the metal resulting in a metal-fiber wire-like strand with a diameter of up to 1/16 inch. The strand is cooled to ambient temperature to solidify the metal matrix material.

THE APPARATUS

Now referring to the drawing, the apparatus shown includes a tube-like zone for gaseous reactions 12, lying within and heated by furnace 14. The reaction zone is supplied with a flow of the chloride gases admitted through duct inlet 18. Prior to entry to the reaction zone 12 the chloride gases pass over the surface of a supply of molten zinc 20 in a receptacle also within furnace 14. As the chloride gases pass over the molten zinc 20 a quantity of zinc vapor is entrained by and admixed therewith.

At one side of the reaction zone 12 and furnace 14 (to the right as viewed in FIG. 1) is located a chamber 22 having mounting means for rotatably supporting fiber supply reel 24. Carbon fibers 26 are unspooled from reel 24 and fed into and transversely through zone 14. The fibers 26 emerge from the left side of zone 12 through duct 28 into the interior of closed container 32 within which is maintained a molten metal bath 34. Fibers 26 are immersed in the metal bath 34 as they are drawn around pulley 36 and thereafter exit upwardly out of container 32. At the container exit point the treated fibers 14 are cooled to ambient temperature and stored on take-up reel 38.

The interiors of chamber 22, reaction zone 12 and container 32 are intercommunicated and are open to the air only through exhaust 42 exiting from chamber 22. To supplement the gas pressure of the reacting gases in these interiors an inert gas is admitted through duct inlet 44 at such a rate to raise the pressure up to or slightly above ambient so as to preclude the presence of any oxygen from the surrounding air. The flow of inert gas also serves to purge the interior of the apparatus of gaseous by-products, principally zinc chloride, created in the reaction zone 12.

OPERATION

In the operation of the apparatus, with a fiber supply reel 24 in place, the fiber 26 is threaded from the reel 24 through zone 12, around pulley 28 and onto take-up reel 38. A charge of molten metal matrix material, e.g. aluminum alloy, is loaded into container 32, zinc 20 is placed within its receptacle, and the reaction zone is heated to operating temperature by furnace 14. A flow of the metal chloride and boron chloride is initiated through their inlet 18 and inert gas is admitted to the reaction zone via inlet 44. As the chloride gases enter zone 12 they are co-mingled with vapor from the molten zinc 20. The take-up reel 38 is driven to draw the carbon fibers 26 through the reaction zone at a rate which may vary from 1 to 12 inches per minute.

The reaction among the chloride gases and zinc vapor results in the deposition of the metal boride as an intimately bonded coating on all surfaces of the multifilament fiber 26. The density of the chlorides and zinc vapor within the reaction zone and the length of time the fibers remain in the zone is utilized to control the thickness of the metal boride coating applied to the fibers.

After passing through the reaction zone 12 the fibers 26 are immersed in the molten bath 34 of the metal matrix material. With the enhancement of the wettability of the fibers by the presence of the metal boride coating, the molten metal rapidly infiltrates all the microscopic interstices of the fibers and clings to their surfaces. The fibers exit from container 32 and cool to room temperature to solidify the metal matrix material adsorbed by the fibers. The thus prepared fiber-metal matrix composite strand is stored on take-up reel 38 which should have a minimum diameter dependent upon the diameter of the strand in order to avoid excessive deformation bending of the composite.

Bar stock and structural parts of the composite are fabricated by cutting the strands of the fiber-metal material to length and laying up in tightly packed bundles of the selected configuration. The bundles are heated under pressure to render them integral. Many variations in fabrication techniques are well known from prior work with other types of composites.

EXAMPLE I

In one application of the process utilizing the apparatus and procedure as previously described, Thornel 50 fibers were passed through the gaseous reaction zone at a rate of 6 inches per minute resulting in the fibers being subject to boride coating process for approximately two and one half to three minutes. The temperature of the zone was maintained at an average of 600° C. and varied between 600° and 700° C. After emerging from the reaction zone the fibers were passed through a molten bath of Al 201, an alloy comprising Al-4.8 Cu-0.5 Ag- 0.25 Mg-0.25 Mn, the alloying metals being expressed in weight percent.

Twenty one samples of the wire-like aluminum-graphite strand made were inspected and tested and were found to an average tensile strength of 90.9 ksi with a peak strength of 110.2 ksi. The fiber content of the strands varied from 28.8 – 30.6% with the remainder being the aluminum alloy matrix material.

EXAMPLE II

The wire-like strand produced in the example I was cut in pieces of equal length which in turn were laid up into parallel packs and hot pressed into bars ¼ inch by ¼ inch in cross section and trimmed to a length of 6 inches. Two bars thus fabricated were tested and found to have tensile strengths of 67.5 ksi and 72.5 ksi respectively. The modulus of elasticity of the bars was 20.0 and 22.0 × $10^6$ psi respectively. The volume percent of fibers in the bars was 30.8 and 30.0.

EXAMPLE III

The process of example I was repeated excepting that the residence or dwell time of the fibers in the reaction zone was reduced to approximately two minutes. Twenty two samples of the wire-like product so produced were tested and possessed an average tensile strength of 100.5 ksi, with a maximum of 115.5 ksi. The percent volume fiber of these samples varied between 27.7 and 29.0%.

EXAMPLE IV

Using the wire-like strands produced by the example III process, two bars were fabricated as in example II. Tests on these bars provided the following respective results:

| | |
|---|---|
| Modulus of elasticity ($10^6$ psi) | 24.9 and 22.3 |
| Tensile strength (ksi) | 85.9 and 89.0 |
| Vol. percent fiber content | 30.6 and 30.9 |

In each of the above examples the reacting gases in the chamber were titanium tetrachloride, boron trichloride and zinc vapor.

The foregoing are exemplary only and it will be apparent to those versed in the art to which the present invention pertains that the materials employed and the process parameters may be varied within the scope of the appended claims.

What is claimed is:

1. The process of improving the wettability of multifilament carbon fibers by molten metal by coating the fibers with titanium boride comprising:
   admixing in a reaction zone a gaseous atmosphere of a chloride of titanium, boron chloride and zinc vapor;
   heating the reaction zone;
   and subjecting the carbon fibers to the atmosphere within the reaction zone whereby a titanium boride is formed on the surfaces of the multifilament fibers.

2. The process as defined in claim 1 wherein:
   atmospheric oxygen is excluded from the reaction zone by maintaining the pressure within the zone at atmospheric pressure by a supplementary flow of an inert gas into the reaction zone.

3. The process as defined in claim 1 wherein the chloride of titanium is titanium tetrachloride.

4. The process as defined in claim 3 wherein: solid titanium is placed within the reaction zone and reacts with the titanium tetrachloride to form lower chlorides of the metal.

5. The process as defined in claim 3 wherein the reaction zone is maintained at a temperature between 600° and 700° C.

6. The process as defined in claim 1 and further including the impregnation of the fibers with a metal matrix material of aluminum or aluminum alloy.

7. Method of forming a fiber-metal composite, comprising the steps of:
   forming a coating of titanium boride on a plurality of carbon fibers;
   immersing the coated fibers into a body of molten metal selected from the group consisting of magnesium, lead, zinc, copper, aluminum, tin and alloys of said metals until said metal substantially fills the interstices between said fibers; and
   cooling the metal body with said coated fibers embedded therein to a temperature at which said metal solidifies.

8. Method as defined in claim 7 wherein said coated fibers are immersed in said body of molten metal at ambient atmospheric pressure.

9. Method as defined in claim 7 wherein the step of coating includes the reduction of a gaseous compound of titanium in the presence of said fibers whereby said titanium boride is produced.

10. Method as defined in claim 7 wherein said metal is aluminum.

11. Method as defined in claim 9 wherein the step of coating is effected by reducing with zinc vapor a gaseous compound of titanium in the presence of said fibers.

12. Method as defined in claim 8 wherein the step of coating is effected by reducing with zinc vapor a gaseous compound of boron and a gaseous compound of titanium in the presence of said fibers.

13. Method as defined in claim 9 wherein the step of coating is effected by reducing a gaseous compound of boron and a gaseous compound of titanium in the presence of said fibers.

14. Method as defined in claim 13 wherein said step of coating is effected for a time sufficient to deposit on each of said fibers a layer having a thickness in the range between about 100 to 20,000 A.

15. Method as defined in claim 13 wherein the relative proportion of said compound of boron to said compound of titanium is sufficiently large so that the titanium boride formed in said layer upon reduction of said compounds is substantially $TiB_2$.

16. Method as defined in claim 13 wherein the relative proportion of said compound of boron to said compound of titanium is small enough that the titanium boride formed in said layer upon reduction of said compounds is substantially TiB.

17. The method of forming a fiber-metal composite comprising the steps:
   subjecting a plurality of carbon fibers to an atmosphere including a gaseous compound of titanium, a gaseous compound of boron, and zinc vapor, said atmosphere being at an elevated temperature at which the both said compounds are normally reduced by the zinc vapor, said fibers being subjected to said atmosphere for a time sufficient to render them wettable by a molten metal; thereafter,
   immersing the carbon fibers in a body of molten metal selected from the group consisting of magnesium, lead, zinc, copper, aluminum, tin, and alloys of said metals, until said metal substantially fills the interstices among said fibers; and
   cooling the metal filled fibers to a temperature at which said metal solidifies.

* * * * *